(12) United States Patent
Shukh

(10) Patent No.: US 8,406,041 B2
(45) Date of Patent: *Mar. 26, 2013

(54) SCALABLE MAGNETIC MEMORY CELL WITH REDUCED WRITE CURRENT

(76) Inventor: Alexander Mikhailovich Shukh, Savage, MN (US)

( * ) Notice: Subject to any disclaimer, the term of this patent is extended or adjusted under 35 U.S.C. 154(b) by 367 days.

This patent is subject to a terminal disclaimer.

(21) Appl. No.: 12/830,580

(22) Filed: Jul. 6, 2010

(65) Prior Publication Data

US 2012/0155153 A1 Jun. 21, 2012

Related U.S. Application Data

(60) Provisional application No. 61/223,921, filed on Jul. 8, 2009.

(51) Int. Cl.
*G11C 11/00* (2006.01)

(52) U.S. Cl. .......................... 365/158; 365/171; 365/173

(58) Field of Classification Search .................. 365/158, 365/171, 173
See application file for complete search history.

(56) References Cited

U.S. PATENT DOCUMENTS

| | | | |
|---|---|---|---|
| 5,695,864 A | 12/1997 | Slonczewski | |
| 6,532,164 B2 | 3/2003 | Redon | |
| 6,844,605 B2 | 1/2005 | Nishimura | |
| 6,845,038 B1 | 1/2005 | Shukh | |
| 6,967,863 B2 | 11/2005 | Huai | |
| 7,006,375 B2 | 2/2006 | Covington | |
| 7,224,601 B2 | 5/2007 | Panchula | |
| 7,239,541 B2 | 7/2007 | Saito et al. | |
| 7,307,302 B2 | 12/2007 | Saito | |
| 7,313,013 B2 | 12/2007 | Sun et al. | |
| 7,313,015 B2 | 12/2007 | Bessho | |
| 7,432,574 B2 | 10/2008 | Nakamura | |
| 7,480,171 B2 | 1/2009 | Peng et al. | |
| 7,508,042 B2 | 3/2009 | Guo | |
| 7,511,991 B2 | 3/2009 | Saito et al. | |
| 7,532,505 B1 | 5/2009 | Ding | |
| 2006/0291276 A1* | 12/2006 | Nozieres et al. | ............... 365/158 |
| 2007/0086121 A1 | 4/2007 | Nagase et al. | |
| 2007/0215967 A1 | 9/2007 | Wu et al. | |
| 2008/0037314 A1* | 2/2008 | Ueda | .............................. 365/158 |
| 2009/0027810 A1 | 1/2009 | Horng et al. | |

OTHER PUBLICATIONS

M. Nakayama et al., Spin transfer switching in TbCoFe/CoFeB/MgO/CoFeB/TbCoFe magnetic tunnel junctions with perpendicular magnetic anisotropy, JAP, v. 103, 07A710 (2008).

H. Ohmori et al., Perpendicular magnetic tunnel junction with tunneling magnetoresistance ratio of 64% using MgO ..., JAP vol. 103, 07A911 (2008).

Z. Li et al., Perpendicular Spin Torques in Magnetic Tunnel Junctions, Physical Review Letters, vol. 100, 246602 (2008).

T. Hatori et al., MTJ Elements With MgO Barrier Using RE-TM Amorphous Layers for Perpendicular MRAM, IEEE Trans. Magn., v. 43, No. 6, p. 2331 (2007).

(Continued)

*Primary Examiner* — Huan Hoang

(57) ABSTRACT

One embodiment of a magnetic memory cell comprises a magnetoresistive element including a free layer comprising a reversible magnetization direction directed substantially perpendicular to a film plane, a pinned layer comprising a fixed magnetization direction directed substantially perpendicular to the film plane, and a tunnel barrier layer disposed between the free and pinned layers; means for providing a bias magnetic field pulse along magnetic hard axis of both the free and pinned layers, means for providing a spin-polarized current pulse through the magnetoresistive element along magnetic easy axis of both the free layer and the pinned layer, wherein the magnetization direction in the free layer is reversed by a collective effect of the bias magnetic field pulse and the spin-polarizing current pulse. Other embodiments are described and shown.

20 Claims, 9 Drawing Sheets

OTHER PUBLICATIONS

X. Zhu and J.-G. Zhu, Spin Torque and Field-Driven Perpendicular MRAM Designs Scalable to Multi-Gb/Chip Capacity, IEEE Trans. Magn, v.42, No. 10, p. 2739 (2006).

Z. Diao et al., Spin transfer switching and spin polarization in magnetic tunnel junctions with MgO and Al2O3 barriers, App. Phys. Letters, v. 87, 232502 (2005).

* cited by examiner

SCALABLE MAGNETIC MEMORY CELL WITH REDUCED WRITE CURRENT

CROSS-REFERENCE TO RELATED APPLICATION

This invention claims benefit of U.S. Provisional Patent Application No. 61/223,921 entitled "SCALABLE MAGNETIC RANDOM ACCESS MEMORY WITH REDUCED WRITE CURRENT" filed Jul. 8, 2009, which is hereby incorporated by reference in its entirety.

FEDERALLY SPONSORED RESEARCH

Not Applicable

SEQUENCE LISTING OR PROGRAM

Not Applicable

FIELD OF THE INVENTION

The present invention relates to a magnetic random access memory and, more specifically, to a memory cell utilizing magnetic tunnel junction with perpendicular magnetization orientation and hybrid writing mechanism.

BACKGROUND OF THE INVENTION

Magnetic random access memory (MRAM) is a new technology that will likely provide superior performance over existing flash memory technology and may even replace hard disk drives in certain applications requiring a compact nonvolatile memory device. In MRAM bits of data are represented by a magnetic configuration of a small volume of ferromagnetic material and its magnetic state that can be measured by magnetoresistive (MR) effect during a readback operation. The MRAM typically includes a two-dimensional array of memory cells with each cell containing one magnetic tunnel junction (MTJ) element that can store at least one bit of data.

Conventional MRAM designs employ an array of MTJ elements that are based on a giant magnetoresistance (GMR) where the elements represent patterned thin film multilayers that include at least one pinned magnetic layer and one free magnetic layer separated from each other by a thin tunnel barrier layer. The free layer has two stable orientations of magnetization that are parallel or anti-parallel to the fixed orientation of magnetization in the pinned layer. Resistance of the MTJ depends on the mutual orientation of the magnetizations in the free and pinned layers and can be effectively measured. A resistance difference between the parallel and anti-parallel states of the MTJ can exceed 600% at room temperature.

The orientation of the magnetization in the free layer may be changed from parallel to anti-parallel or vice-versa by applying an appropriate cross-point addressing magnetic fields to the selected MTJ, by passing a spin-polarized current through the selected junction, or by using a combination of the external magnetic field along with spin-polarized current simultaneously affecting the selected MTJ.

Majority of the current MRAM designs uses the free and pinned layers made of magnetic materials with in-plane orientation of the magnetization (anisotropy) in the MTJ. The in-plane MRAM (i-MRAM) suffers from a large cell size, low thermal stability, poor scalability, necessity to use MTJ with a special elliptical shape, and from other issues, which substantially limit the i-MRAM capacity and its application at technology nodes below than 90 nm. MRAM with a perpendicular orientation of magnetization (p-MRAM) in the free and pinned layers of MTJ can solve the above problems since the magnetic materials with the perpendicular magnetization have a high intrinsic crystalline anisotropy that provides MTJ with the high thermal stability, excellent scalability and a possibility using junctions having any shape. However, current designs of the p-MRAM suffer from high write current or from the necessity to use additional write conductors that limit MRAM density.

FIG. 1 shows a schematic view of a p-MRAM cell 10 according to the U.S. Pat. No. 6,845,038 (Shukh). The cell 10 employs a field induced switching mechanism of MTJ based on simultaneous effect of two intersecting magnetic fields. The MTJ comprises a pinned layer 14 and a free layer 18 both having their magnetizations oriented substantially perpendicular to layers plane in their equilibrium states and separated from each other by a thin tunnel barrier layer 16. The p-MRAM cell 10 further comprises two intersecting write lines: a word write line WWL and a bit write line WBL; and two contact layers 12 and 22. Write currents $I_{W1}$ and $I_{W2}$ running through the lines WBL and WWL generate magnetic write fields $H_{W1}$ and $H_{W2}$, respectively. The orientation of magnetization $M_{18}$ in the free layer 18 can be reversed by a simultaneous effect of the orthogonal magnetic fields $H_{W1}$ and $H_{W2}$.

In a "read" operation a selection transistor TR is opened by a positive bias voltage applied to its gate through a word line WL. The sense current of a very small magnitude flows through a bit line (BL), MTJ and TR. The current enables the resistance of the MTJ to be measured. By its comparison with the resistance of a reference memory cell (not shown), a magnetic state of the selected memory cell 10 can be determined. The memory cell 10 has a high thermal stability, good scalability and does not require special shape of the MTJ. However, the p-MRAM according to the prior art has an increased cell size, requires relatively high write currents $I_{W1}$ and $I_{W2}$, and suffers from half-selected cell problem.

FIG. 2 shows a structure of magnetic memory element 20 according to another prior art disclosed in the U.S. Pat. No. 7,432,574 (Nakamura et al.). The MTJ includes a pinned layer 14 and a free layer 18 both having perpendicular magnetizations $M_{14}$ and $M_{18}$, respectively, separated from each other by a thin tunnel barrier layer 16. An insertion layer 24 is arranged between the tunnel barrier layer 16 and the free layer 18. The insertion layer 24 is made of a magnetic material with a saturated magnetization $M_S \leq 600$ emu/cm$^3$ that is necessary to obtain a GMR ratio of 20% or higher. Switching of the magnetization orientation $M_{18}$ in the free layer 18 is provided by a spin-polarized current $I_S$ running through the MTJ.

The spin-polarized current $I_S$ of a controlled polarity, magnitude, and pulse duration can reverse the orientation of magnetization $M_{18}$ in the free layer 18 by a spin momentum transfer. The spin momentum transfer is a phenomenon that occurs in current perpendicular to the plane (CPP) GMR devices that have cross-sectional areas of the order $10^4$ nm$^2$ or less. Strength of a spin torque is directly proportional to the $I_S$ current density running through the MTJ. The spin induced switching mechanism provides excellent cell selectivity in MRAM array; substantially lower switching spin-polarized current than that of the field induced switching MRAM and a possibility of substantial reduction of cell size.

However, maintaining a high precision of the current $I_S$ magnitude and pulse duration is extremely difficult. Moreover the spin-polarized current density required for switching is too high for integration with current CMOS technology. In addition, the high switching current running across the tunneling barrier layer 16 can create long-term reliability problems, for instance break down.

FIG. 3 shows a schematic cross-sectional view of MTJ element 30 with in-plane magnetizations $M_{14}$ and $M_{18}$ in the pinned 14 and free 18 layers, respectively, separated by a tunnel barrier layer 16. The MTJ element 30 employs a hybrid write mechanism according to a prior art disclosed in the U.S. Pat. No. 7,006,375 (Covington). An antiferromagnetic layer 32 controls an orientation of magnetization in the pinned layer 14 by exchange coupling between the layers. The hybrid write mechanism comprises producing a bias magnetic field $H_B$ along a magnetic hard axis of a free layer 18, and passing a spin-polarized current $I_S$ through the MTJ element 30 to reverse an orientation of the magnetization $M_{18}$ in the free layer 18 by spin-induced switching. The bias magnetic field $H_B$ induced by a bias current $I_B$ of a relatively small magnitude facilitates and accelerates the magnetization $M_{18}$ reversal by the spin-polarized current $I_S$. However the MTJ element 30 suffers from the same problems as other MRAM designs with in-plane magnetization in the free layer 18, such as poor thermal stability and scalability, relatively high switching current $I_S$, necessity to use MTJ element of a special shape, and others.

What is needed is a simple design of MRAM having high thermal stability, excellent scalability, and low switching current that does not require a special shape of the MTJ element.

SUMMARY OF THE INVENTION

The present invention provides a magnetic memory cell with a perpendicular magnetization and a method of writing to the memory cell.

A magnetic memory cell according to an aspect of the present invention comprises a magnetoresistive element comprising a free layer with a reversible magnetization direction directed substantially perpendicular in its equilibrium state to a film plane, a pinned layer with a fixed magnetization direction directed substantially perpendicular to the film plane, and a tunnel barrier layer disposed between the free and pinned layers; means for providing a bias magnetic field along a magnetic hard axis of both the free and pinned layers and comprising connected in series a first conductor line disposed adjacent the magnetoresistive element, a voltage source and a bias current source; and means for providing a spin-polarized current through the magnetoresistive element along a magnetic easy axis of both the free layer and the pinned layer, and comprising connected in series the voltage source, a selection device, a spin-polarizing current driver connected to the selection device by a second conductor line intersecting the first conductor line; wherein the direction of magnetization in the free layer is reversed by a collective effect of a bias magnetic field pulse and a spin-polarizing current pulse; and wherein the magnetoresistive element comprises at least one magnetic layer whose magnetization having a perpendicular direction in its equilibrium state can be tilted by the bias magnetic field to facilitate the magnetization direction reversal in the free layer by the spin-polarized current.

A method of writing to a magnetic memory cell according to an aspect of the present invention comprises: providing a magnetic tunnel junction element adjacent to a first conductor line and means for current supply, wherein the magnetic tunnel junction element includes a pinned layer having a fixed magnetization direction directed substantially perpendicular to a film plane, a free layer having a reversible magnetization direction directed substantially perpendicular in its equilibrium state to the film plane, and a tunnel barrier layer residing between the pinned layer and the free layer; driving a bias current pulse through the first conductor line in a proximity to but not through the magnetic tunnel junction element and producing a bias magnetic field along magnetic hard axis of both the pined layer and the free layer; driving a spin-polarized current pulse through the tunnel magnetic junction element along magnetic easy axis of both the pinned layer and the free layer, and producing a spin momentum transfer; whereby the magnetization direction in the free layer is reversed by a collective effect of the substantially superimposed bias current and spin-polarized current pulses; wherein a magnitude of the bias current pulse does not change substantially when the spin-polarized current pulse turns on or turns off; wherein a magnitude of the spin-polarized current pulse does not change substantially when the bias current pulse turns on or turns off; and wherein the magnetic tunnel junction element comprises at least one magnetic layer whose magnetization having a perpendicular direction in its equilibrium state can be tilted by the bias magnetic field to facilitate the magnetization direction reversal in the free layer by the spin-polarized current.

DESCRIPTION OF THE PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digits of reference numbers appearing in the Figures generally corresponds to the Figure number in which that component is first introduced, such that the same reference number is used throughout to refer to an identical component which appears in multiple Figures.

Figure 1:
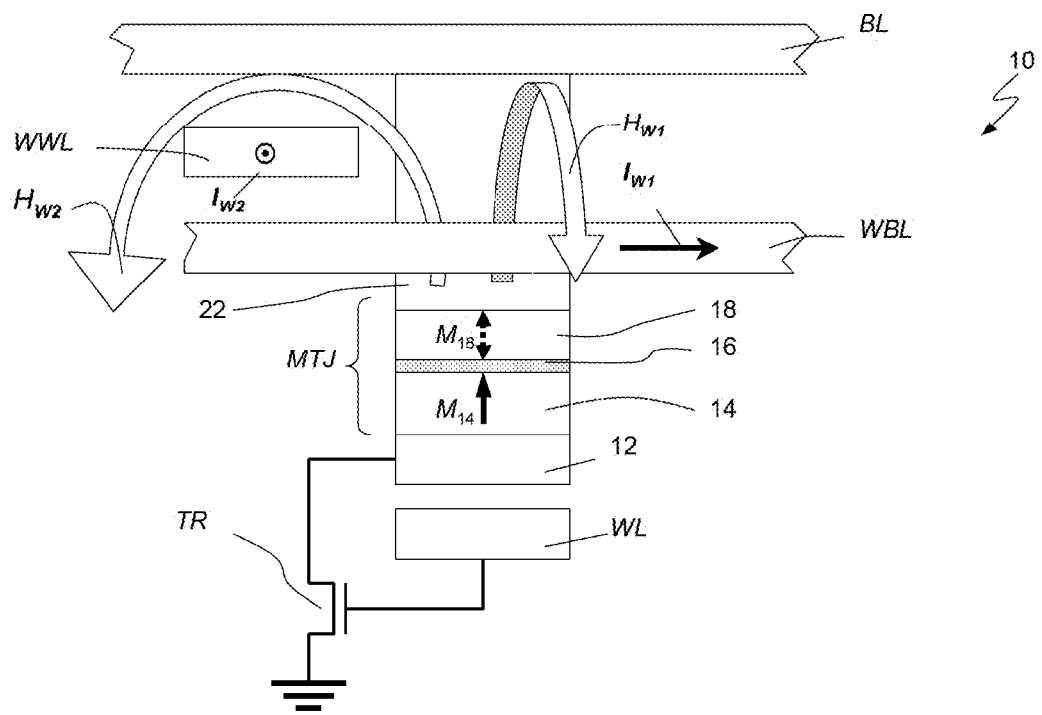
FIG. 1 illustrates a schematic view of a prior art MRAM cell with a perpendicular magnetization orientation in free and pinned layers of MTJ and with magnetic field induced switching.
Figure 2:
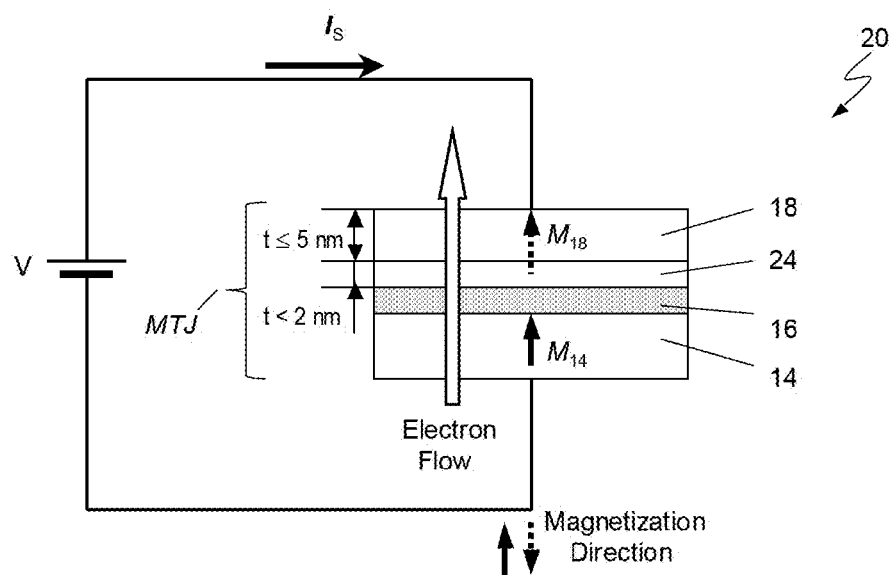
FIG. 2 is a schematic side view of a magnetic memory element according to a prior art with a perpendicular magnetization orientation in free and pinned layers and spin-induced switching.
Figure 3:
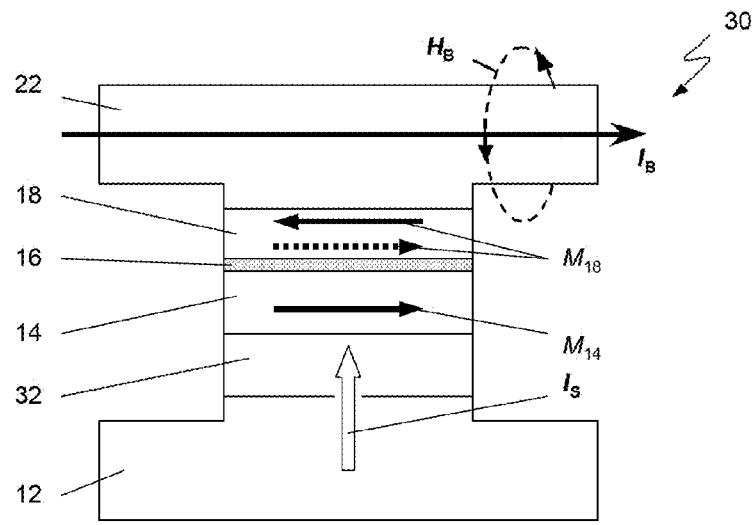
FIG. 3 is a schematic cross-sectional view of a prior art MTJ element with in-plane magnetization orientation in free and pinned layers and with a hybrid switching mechanism.
Figure 4:
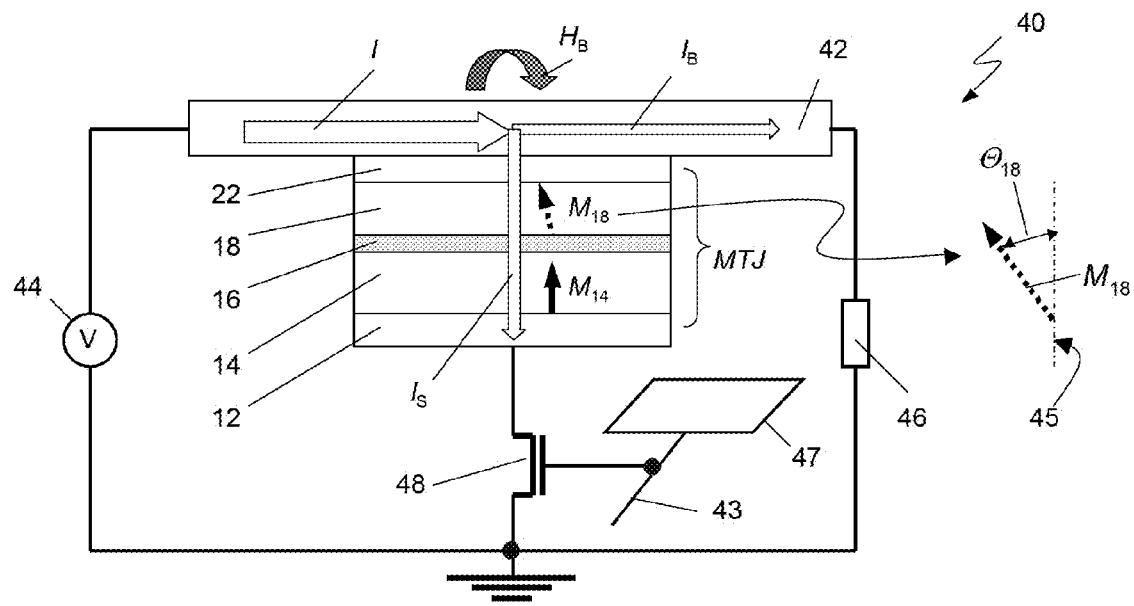
FIG. 4 is a schematic view of MRAM cell with perpendicular magnetization orientation in free and pinned layers employing a hybrid switching mechanism according to one embodiment of the present invention.

FIG. 4 shows a schematic view of MRAM cell 40 comprising a MTJ element, a first conductor line 42, a second conductor line 43, a voltage source 44, a bias current circuitry 46, a spin-polarized current circuitry 47, and a selection device 48. The voltage source 44 is connected in series with the first conductor line 42 and the bias current circuitry 46. The MTJ element is connected in series with the voltage source 44 and the selection device 48 that is connected to the spin-polarized current circuitry 47 through the second conductor line 43. The MTJ element is disposed at an intersection of the conductor lines 42 and 43 in vertical space between them.

In some embodiments the MTJ element of the memory cell 40 includes a pinned layer 14, a free layer 18 with a tunnel barrier layer 16 disposed between the layers. The pinned layer 14 has a fixed magnetization $M_{14}$ oriented substantially perpendicular to a layer plane. The free layer 18 has a changeable orientation of magnetization $M_{18}$ that is oriented substantially perpendicular to a layer plane in its equilibrium state. The magnetization $M_{18}$ of the free layer 18 can be reversed by a spin-polarized current $I_S$ running through the MTJ in a direction perpendicular to a MTJ plane or by a collective effect of the spin-polarized current $I_S$ along with a bias magnetic field $H_B$. The direction of the magnetization $M_{18}$ in the free layer 18 can be set into parallel or anti-parallel configuration with respect to the pinned layer 14 by simply changing the direction of the spin-polarized current $I_S$ in the MTJ element. The MTJ element further includes two contact layers 12 and 22, wherein the first contact layer 22 is placed between the first conductor line 42 and the free layer 18 of the MTJ, and the second contact layer 12 is positioned between the pinned layer 14 and the selection device 48.

Spin-induced switching mechanism provides excellent cell selectivity in the MRAM array but it is very sensitive to a magnitude and duration of the spin-polarized current pulse. Besides, the spin-polarized current required to reverse the magnetization in the free layer 18 is high enough and can cause degradation or even break down of the tunnel barrier layer 16. To reduce the spin-polarized switching current $I_S$ and to improve control of magnetization reversal in the free layer 18 a bias magnetic field $H_B$ is applied along hard magnetic axis of both the free pinned 14 and free 18 layers.

The bias magnetic field $H_B$ induced by a pulse of the bias current $I_B$ running through the first conductor line 42 is applied to the free layer 18 along its hard axis. The field $H_B$ is strong enough to tilt the magnetization $M_{18}$ on an angle $\Theta_{18}$ relatively to an axis 45 that is perpendicular to a layer plane. A reversal of the magnetization $M_{18}$ in the free layer 18 will occur when a pulse of the spin-polarized current $I_S$ running through the MTJ overlays in time the pulse of the bias magnetic field $H_B$. To reduce a total switching energy it is desirable that the pulses of the currents $I_B$ and $I_S$ substantially superimposed each other. Order of the pulses can be any.

Figure 5:
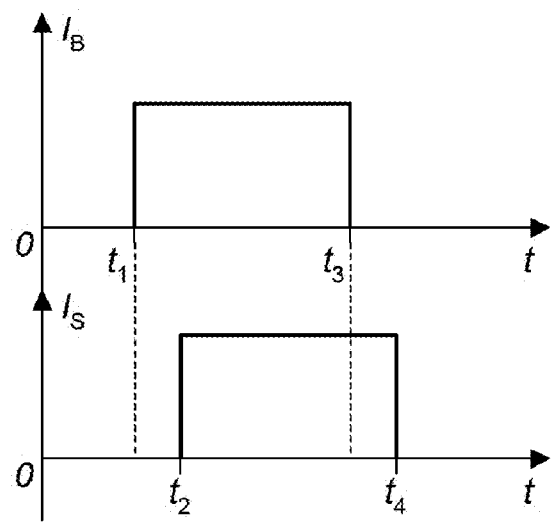
FIG. 5 is a graph illustrating a timing diagram of a bias current pulse and a spin-polarized current pulse during MTJ switching.

FIG. 5 illustrates a timing diagram of the bias $I_B$ and the spin-polarized $I_S$ current pulses during writing to the memory cell 40. At a time $t_1$, the bias current $I_B$ in the first line 42 is turned on. The current $I_B$ induces a magnetic field $H_B$ in the vicinity of the line 42 that is proportional to the current magnitude and is inverse proportional to a distance from the line 42. The bias magnetic field $H_B$ tilts the magnetization $M_{18}$ in the free layer 18 on the angle $\Theta_{18}$ relatively to the perpendicular axis 45. The orientation of the magnetization $M_{14}$ in the pinned layer 14 does not change due to a substantially higher coercivity of the pinned layer relatively to the coercivity of the free layer 18. At a time $t_2$, a spin-polarized current $I_S$ in turned on by applying a positive bias voltage to the gate of the selection transistor 48 through the second conductor line 43. Magnitude, duration and timing of the current $I_S$ pulse are controlled by the spin-polarized current circuitry 47. The magnitude of the bias current $I_B$ remains constant when the spin-polarized current $I_S$ turns on or off to offer the controllable tilting angle $\Theta_{18}$. This condition is provided by the bias current circuitry 46 connected in series with the voltage source 44. The spin-polarized current $I_S$ running through the MTJ element should be high enough to cause the magnetization $M_{18}$ reversal in the free layer 18 by a spin momentum transfer when $I_B$ and $I_S$ are both on, and be insufficient to switch the magnetization $M_{18}$ when the bias current $I_B$ is off. Order of the current pulses can be any.

At a time $t_3$, the bias current $I_B$ in the first conductor line 42 and the related bias magnetic field $H_B$ turn off. The tilting angle $\Theta_{18}$ will vanish and the magnetization $M_{18}$ in the free layer 18 will return to one of its equilibrium positions along the axis 45: up or down depending on the polarity of the spin-polarized current $I_S$. In the given configuration of the current pulses the time $t_3$ will determine the end of the magnetization $M_{18}$ reversal in the free layer 18. Time $t_4$ defines the duration of the spin-polarized current $I_S$ pulse in the MTJ. Order of the bias current and spin-polarized current pulses can be any. Duration and magnitude of the current pulses depend on MTJ size and structure, on material properties, and other parameters. Hybrid switching mechanism provides an efficient method of a spin-polarized current reduction in the perpendicular MRAM along with a write speed increase.

Figure 6:
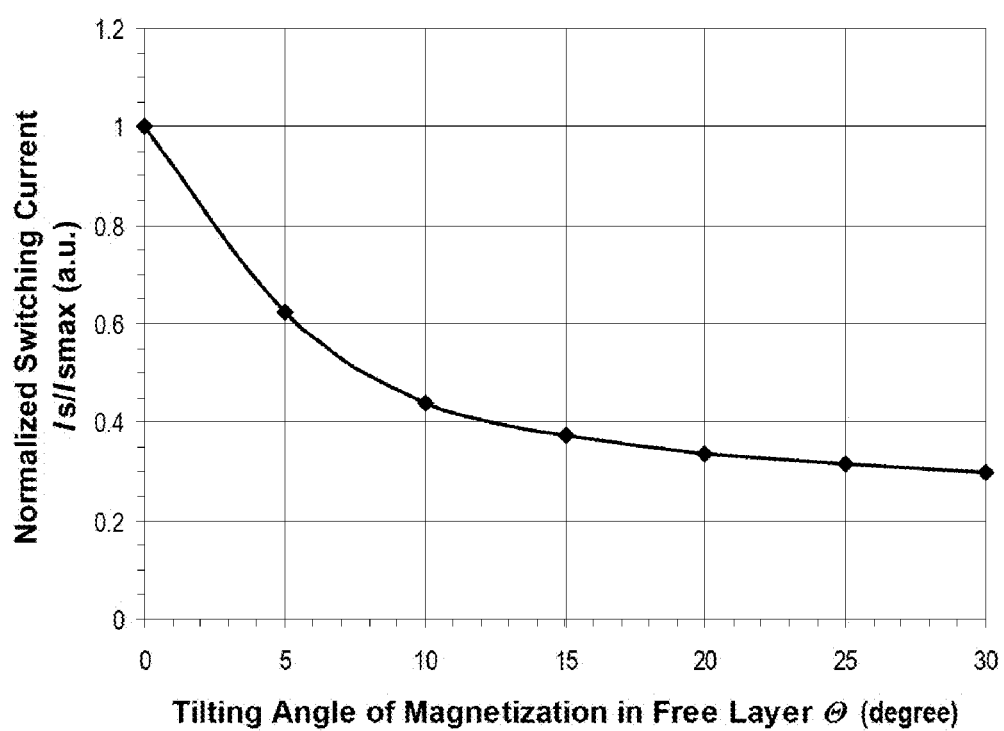
FIG. 6 is a graph illustrating a simulated dependence of normalized magnitude of a spin-polarized switching current on tilting angle of magnetization in the free layer relatively to an axis perpendicular to a layer plane.

FIG. 6 shows a calculated dependence of a normalized magnitude of the spin-polarized switching current $I_S$ that is required to reverse the magnetization $M_{18}$ on the tilting angle $\Theta_{18}$ of the magnetization orientation in free layer 18 relatively to the axis 45. Calculations were done at the fixed duration of the $I_S$ pulse. The switching current $I_S$ decreases rapidly with the angle $\Theta_{18}$. For instance, the magnitude of the spin-polarized current can be reduced almost twice at the tilting angle $\theta_{18}$ of about 8 degrees. On the other hand, the MTJ exhibits its maximum GMR value when the magnetizations in the pinned and free layers are parallel or anti-parallel to each other during read back operation. Hence the optimal combination of writing and reading parameters of the perpendicular MRAM can be achieved when the orientation of the magnetizations in the pinned layers are parallel or anti-parallel to each other during reading and are misaligned (the magnetization in one of the layers is tilted) during writing.

Figure 7:
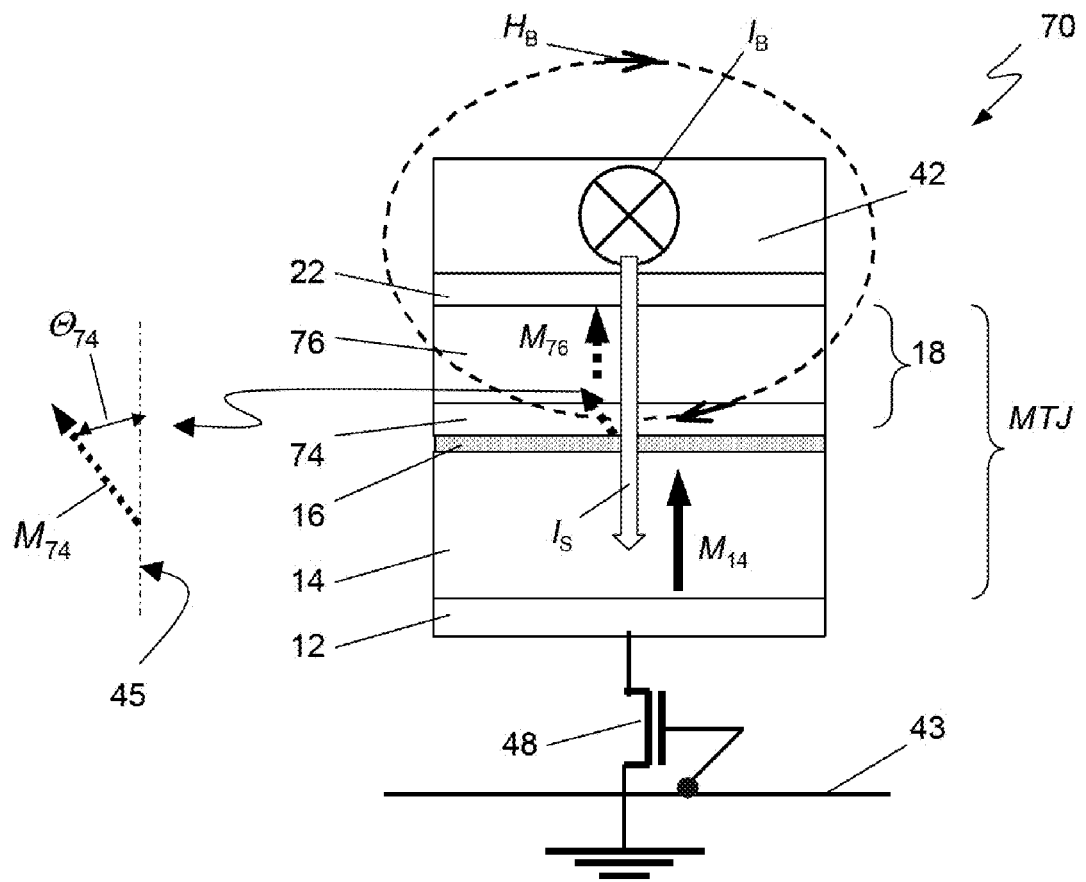
FIG. 7 is schematic cross-sectional view of a perpendicular MRAM cell with bi-layer structure of the free layer according to another embodiment of the present invention.

FIG. 7 shows a schematic cross-sectional view of a perpendicular MRAM cell 70 according to another embodiment of the present invention. The memory cell 70 employs a hybrid switching mechanism. To reduce the bias current $I_B$ the free layer 18 of the MTJ has a bi-layer structure comprising a soft magnetic underlayer 74 and a storage layer 76 wherein the underlayer 74 is disposed adjacent the tunnel barrier layer 16. The layers 74 and 76 are substantially magnetically coupled to each other. The storage layer 76 is made of magnetic material having a first coercivity and a perpendicular anisotropy. The orientation of magnetization $M_{76}$ in the storage layer 76 is substantially perpendicular to a layer plane in its equilibrium state. The underlayer 74 is made of a soft magnetic material with a high spin polarization that is desirable for reduction of the switching current and for GMR increase. Coercivity of the underlayer 74 is substantially lower than that of the layer 76. The material of the underlayer 74 can have either in-plane or perpendicular anisotropy. Due to a strong magnetic coupling with the storage layer 76 the orientation of the magnetization $M_{74}$ in the underlayer 74 is substantially perpendicular to an underlayer plane in its equilibrium state. Bias magnetic field $H_B$ applied along its hard magnetic axis can tilt easily the magnetization $M_{74}$ in the underlayer 74 on the angle $\Theta_{74}$. As a result, the spin-polarized current $I_S$ of the relatively small magnitude and duration can reverse the magnetization 74 in the underlayer and in the storage layer 76 as well since the layers are substantially magnetically coupled to each other. The tilting angle $\Theta_{74}$ depends on bias field strength, thickness and magnetic properties of the underlayer 74 and on strength of magnetic coupling between the layers 74 and 76.

At some conditions, when the soft underlayer 74 is made of magnetic material with in-plane anisotropy the required tilting angle $\Theta_{74}$ can be achieved without use of the magnetic bias field $H_B$. The tilting angle will be provided by a strong demagnetizing field in the underlayer 74 that could not be surmounted by the exchange magnetic coupling between the layers 74 and 76. However, it might result in the reduction of the read-back signal and might require a precise control of the spin-polarized current pulse parameters during writing, such as the magnitude and the duration.

Figure 8:
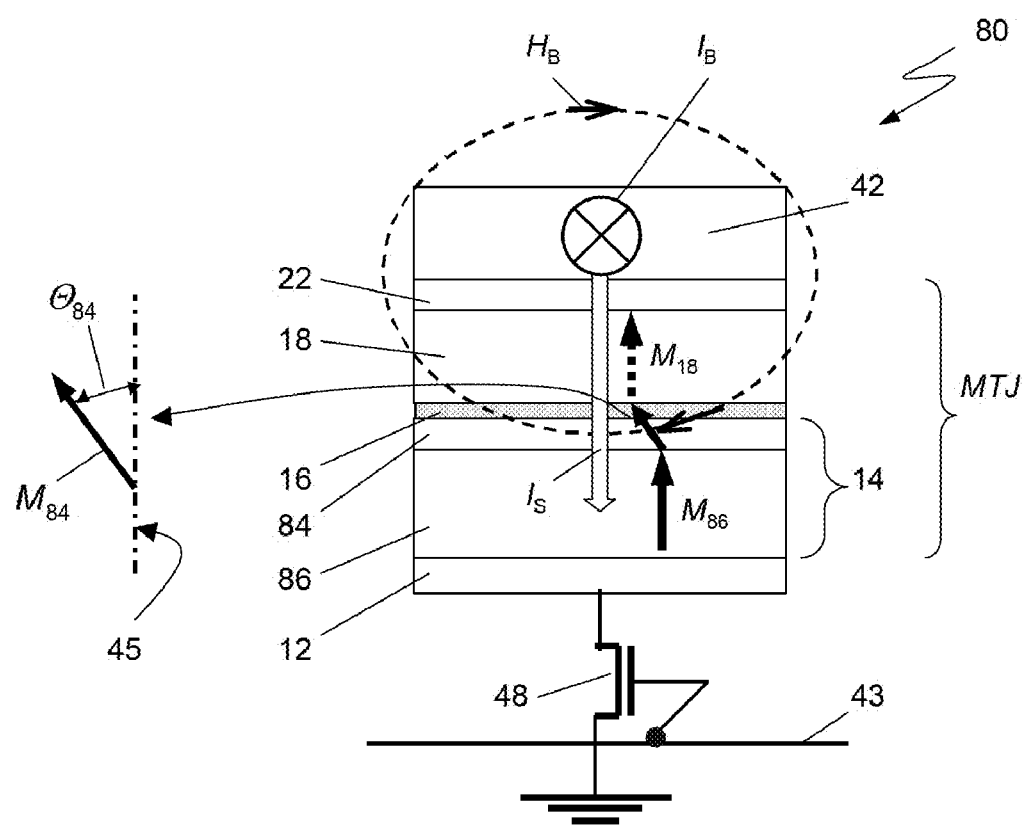
FIG. 8 is a schematic cross-sectional view of a perpendicular MRAM cell with bi-layer structure of the pinned layer according to a yet another embodiment of the present invention.

Yet another embodiment of the present invention is shown in FIG. 8. Perpendicular MRAM cell 80 employs a bi-layer structure of the pinned layer 14 comprising a spin-polarizing layer 84 and a reference layer 86. The thick reference layer 86 is made of a hard magnetic material with a perpendicular anisotropy. The magnetization $M_{86}$ in the reference layer 86 is oriented substantially perpendicular to the layer plane. The spin-polarizing layer 84 is made a soft magnetic material with a high spin polarization. A coercivity of the layer 84 is substantially lower than that of the reference layer 86. The layer 84 can be made of magnetic material with either in-plane or perpendicular anisotropy. The magnetic layers 84 and 86 are substantially magnetically coupled to each other. The reference layer 86 forces the orientation of magnetization $M_{84}$ in the spin-polarizing layer 84 to be substantially perpendicular to the layer plane in its equilibrium state. The magnetization $M_{84}$ can be tilted on the angle $\Theta_{84}$ by the bias magnetic field $H_B$. The bias field $H_B$ is insufficient to tilt the magnetization $M_{18}$ in the free layer 18. To reverse the magnetization $M_{18}$ in the free layer 18 an additional the spin-polarized current $I_S$ is applied to the MTJ.

Figure 9:
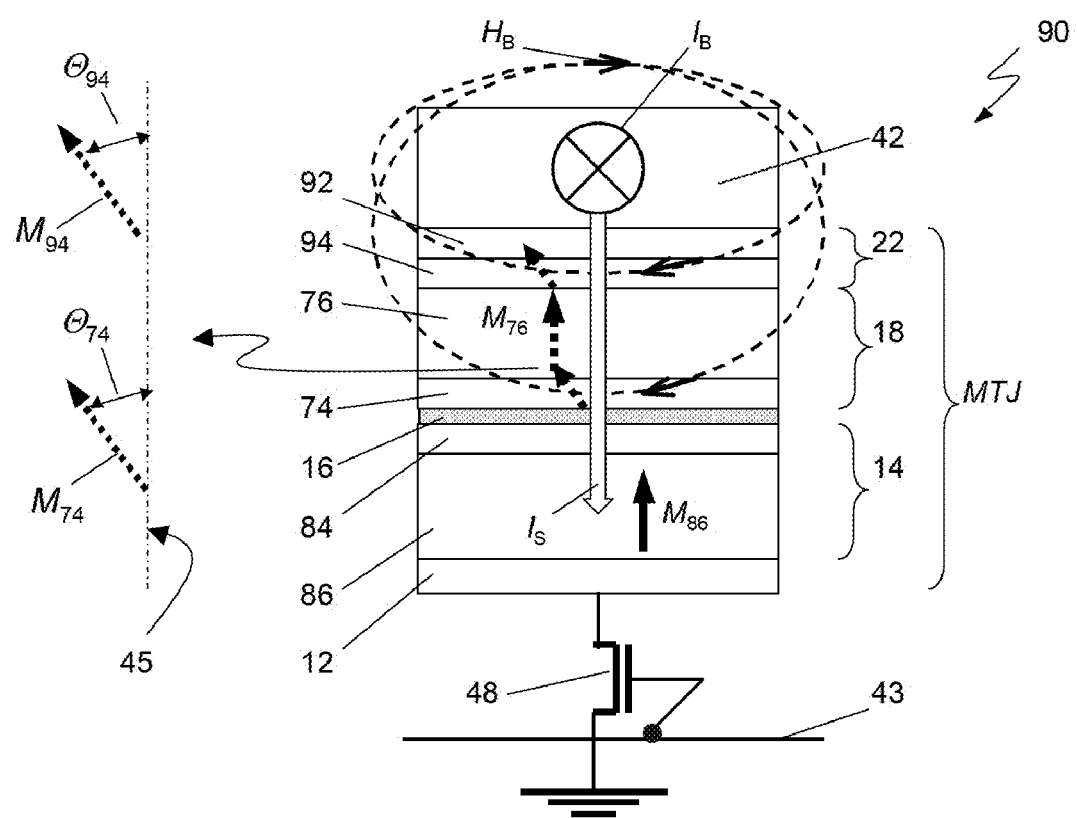
FIG. 9 is a schematic cross-sectional view of a perpendicular MRAM cell with a bi-layer structure of a first contact layer according to a still another embodiment of the present invention.

The MRAM cell 90 shown in FIG. 9 represents yet another embodiment of the present invention. MTJ of the cell 90 includes a pinned layer 14, a free layer 18, a tunnel barrier layer 16 and two contact layers 12 and 22 disposed adjacent the free layer 18 and the pinned layer 14, respectively. The layers 14 and 16 have a bi-layer structure, wherein the pinned layer 14 comprises the spin-polarizing layer 84 and the reference layer 86, and the free layer 14 includes the soft-magnetic underlayer 74 and the storage layer 76. The tunnel barrier layer 16 is disposed between the spin-polarizing layer 84 and the soft magnetic underlayer 74. The first contact layer 22 has a bi-layer structure comprising a non-magnetic sublayer 92 and magnetic sublayer 94, wherein the magnetic sublayer 94 is disposed adjacent the free layer 18. The magnetic sublayer 94 is made of soft magnetic material having a coercively substantially lower than that of the storage layer 76 with either in-plane or perpendicular anisotropy. The sublayer 94 has a substantial magnetic coupling with the free layer 18 that forces the magnetization $M_{94}$ to be oriented substantially perpendicular to the layer plane in its equilibrium state. The bias magnetic field $H_B$ applied to the MTJ along its hard axis tilts the magnetizations both in the soft magnetic underlayer 74 and in the magnetic sublayer 94 on angles $\Theta_{74}$ and $\Theta_{94}$, respectively. The above conditions provide a reduction of the spin-polarized current $I_S$ and facilitate the magnetization reversal in the free layer 18. The second contact layer 12 can also have a multilayer structure, for instance comprising a non-magnetic sublayer and antiferromagnetic sublayer, wherein the antiferromagnetic sublayer being in direct contact with the pinned layer 14 to increase coercivity of the pinned layer 14.

Figure 10:
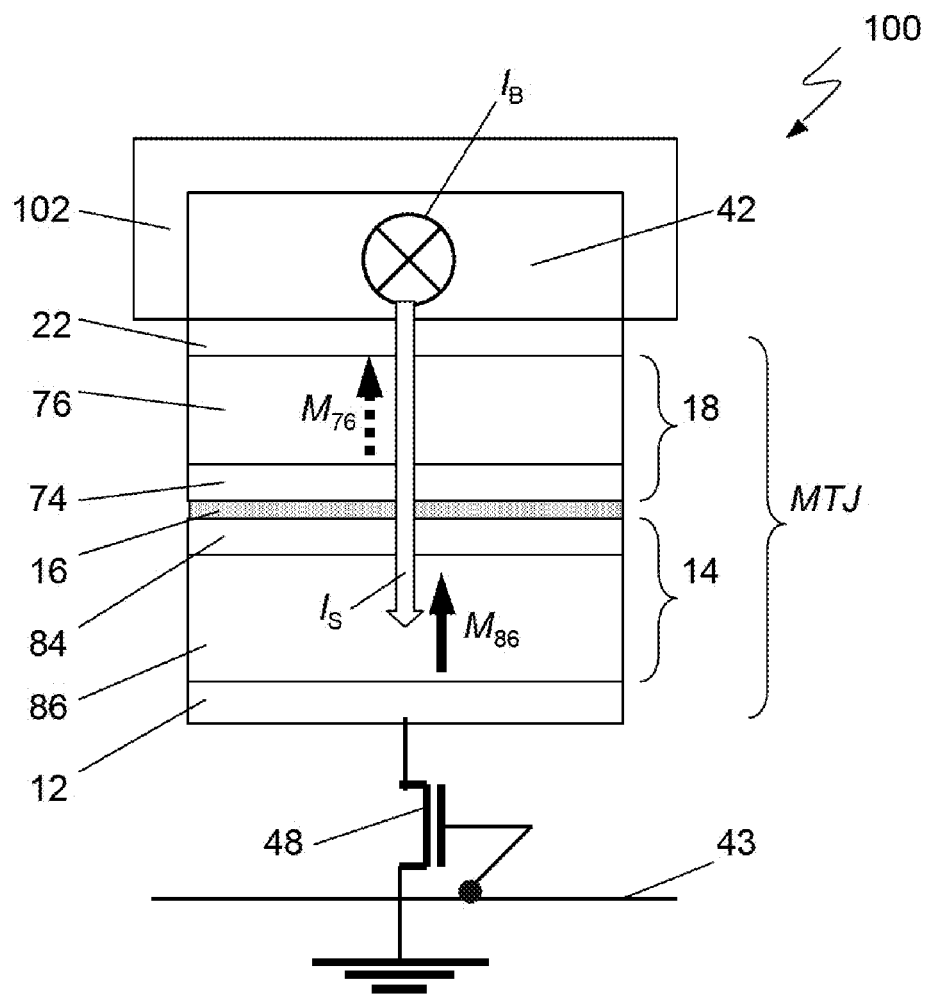
FIG. 10 is a schematic cross-sectional view of a perpendicular MRAM cell with a cladded first conductor line according to a still another embodiment of the present invention.

FIG. 10 shows a schematic view of perpendicular MRAM cell 100 with a cladded first conductor line 42 according to a still another embodiment of the present invention. Cladding 102 made of a soft magnetic material with a substantial permeability magnifies the bias magnetic field $H_B$ in vicinity of the free layer 18 that allows a substantial reduction of the bias current $I_B$ to achieve a desirable tilt angle $\Theta$.

Figure 11:
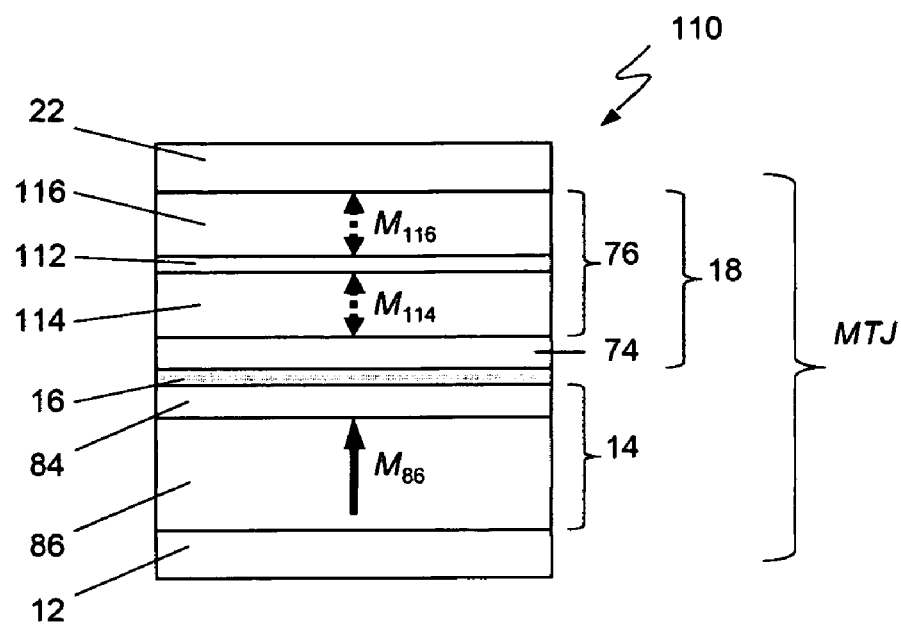
FIG. 11 is a cross-section view of a perpendicular MTJ element with a laminated storage layer of the free layer according to a still another embodiment of the present invention.

FIG. 11 shows a schematic cross-sectional view of perpendicular MTJ 110 that comprises a storage layer 76 made of a multilayer structure. The multilayer structure includes at least two magnetic storage sublayers 114 and 116 separated from each other by a non-magnetic spacer layer 112. The spacer layer 112 provides a substantial magnetic coupling between the sublayers 114 and 116. Type of magnetic coupling between the sublayers 114 and 116 such as ferromagnetic or antiferromagnetic and its strength depend on thickness and on material properties of the spacer layer 112. The storage sublayers 114 and 116 are made of magnetic materials with a perpendicular anisotropy and have their magnetizations $M_{114}$ and $M_{116}$ oriented substantially perpendicular to layer plane. The sublayers 114 and 116 have substantially different coercivities.

Position of the sublayers with high and low coercivity relatively the tunnel barrier layer 16 depends on MRAM cell design, for instance the sublayer 114 of the MTJ 110 has lower coercivity than that of the sublayer 116. The storage sublayer 114 has a substantial magnetic coupling with the soft magnetic underlayer 74. The multilayer structure of the storage layer 76 with the above properties provides the free layer 18 with a high thermal stability along with a reduced spin-polarized current $I_S$. Numbers of magnetic sublayers and non-magnetic spacers respectively in the storage layer 76 can be any.

Figure 12:
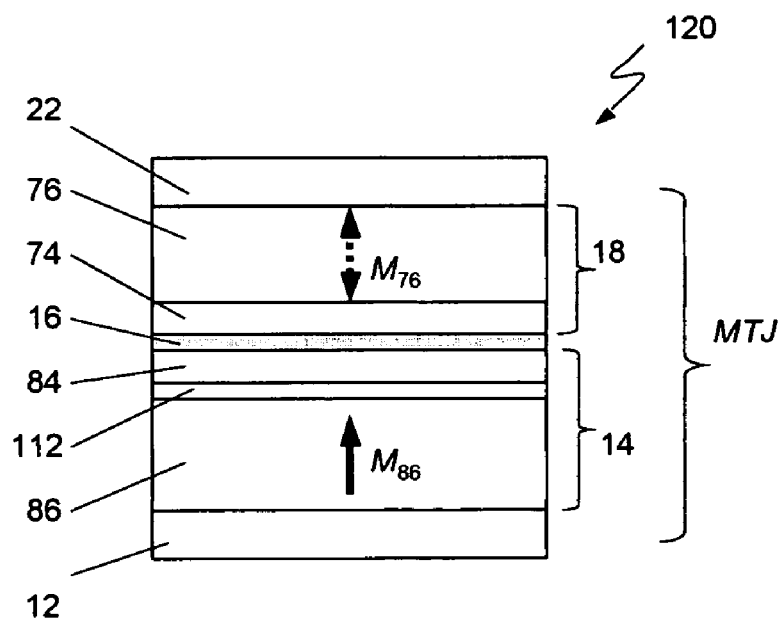
FIG. 12 is a cross-sectional view of a perpendicular MTJ element with tri-layer structure of the pinned layer according to a still another embodiment of the present invention.

In a still another embodiment as shown in FIG. 12, MTJ 120 comprises a laminated structure of the pinned layer 14. The layer 14 includes the spin-polarizing layer 84 and the reference layer 86 separated from each other by a non-magnetic spacer layer 112. The spacer layer 112 provides a possibility of exchange coupling control between the spin-polarizing layer 84 and the reference layer 86 that results in a possibility to reduce the spin-polarized current $I_S$ and to increase a switching speed of the MTJ 120.

Figure 13:
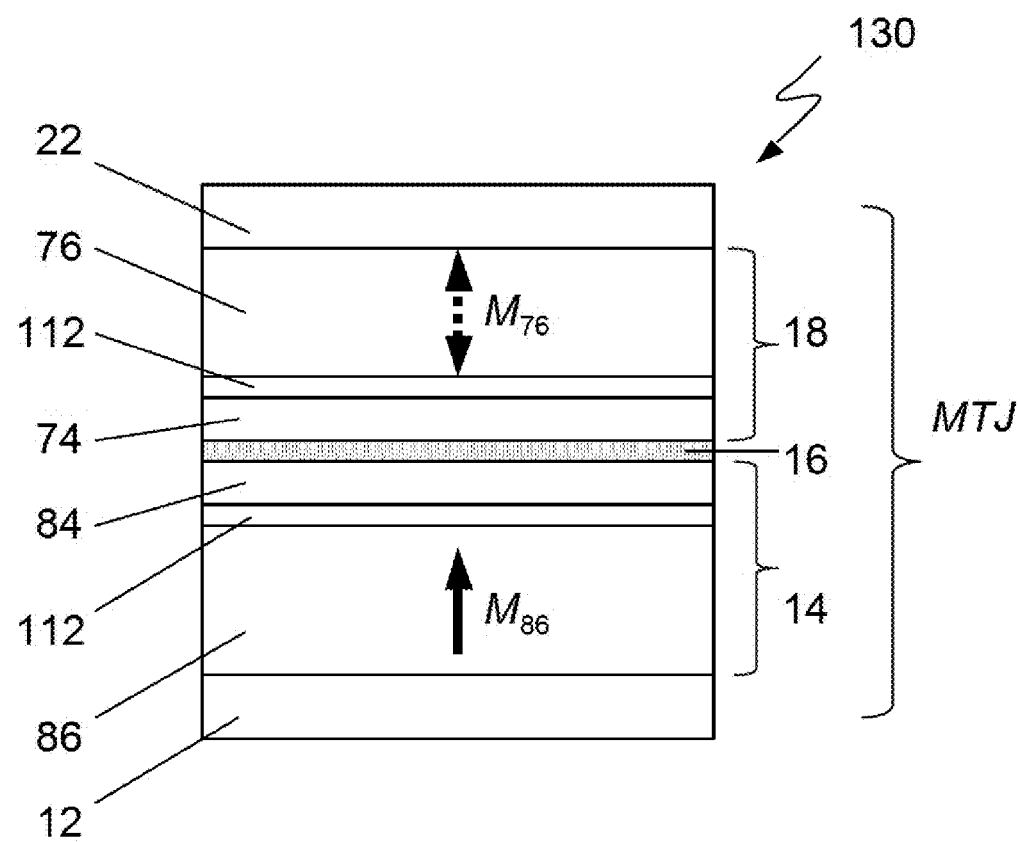
FIG. 13 is a cross-sectional view of a perpendicular MTJ element with tri-layer structures of the free and the pinned layers according to a still another embodiment of the present invention.

MTJ 130 shown in the FIG. 13 represents a still another embodiment of the present invention. The pinned 14 comprises a laminated structure disclosed in the FIG. 12. The free layer 18 includes the soft-magnetic underlayer 74 and the storage layer 76 sandwiched by the non-magnetic spacer layer 112. The spacer layer 112 provides a possibility of exchange coupling control between the layers 74 and 76, and as a result, a possibility to control the spin-polarized current $I_S$ and the switching speed of the MTJ 130.

There is wide latitude for the choice of materials and their thicknesses within the embodiments of the present invention.

The pinned layer 14 has a thickness of about 10-100 nm and more specifically of about 25-50 nm and coercivity measured along its easy axis above than 1000 Oe and more specifically of about 2000-5000 Oe. The layer 14 is made of magnetic material with perpendicular anisotropy such as Co, Fe or Ni-based alloys or their multilayers such as Co/Pt, Co/Pd, Co/Au, CoFe/Pt, Fe/Pt, Fe/Pd, Ni/Cu or similar.

The free layer 18 has a thickness of about 1-30 nm and more specifically of about 5-15 nm and coercivity less than 1000 Oe and more specifically of about 100-300 Oe. The layer 18 is made of soft magnetic material with perpendicular anisotropy such as Co, Fe or Ni-based alloys or multilayers such as Co/Pt, Co/Pd, Co/Au, CoFe/Pt, Fe/Pt, Fe/Pd, Ni/Cu or similar.

The tunnel barrier layer 16 has a thickness of about 0.5-25 nm and more specifically of about 0.5-1.5 nm. The tunnel barrier layer is made of MgO, $Al_2O_3$, $Ta_2O_5$, $TiO_2$, Mg—MgO and similar materials or their laminates.

The contact layers 12 and 22 have a thickness of 1-100 nm and more specifically of about 5-25 nm. The layers are made of Ta, W, Ti, Cr, Ru, NiFe, NiFeCr, PtMn, IrMn or similar conductive materials or their laminates.

The conductor lines 42 and 43 are made of Cu, Al, Au, Ag, AlCu, Ta/Au/Ta, Cr/Cu/Cr and similar materials or laminates.

The soft magnetic underlayer 74 is 0.5-5 nm thick and is made of a soft magnetic material with a substantial spin polarization and coercivity of about 1-200 Oe such as CoFe, CoFeB, NiFe, Co, Fe, CoPt, FePt, CoPtCu, FeCoPt and similar or their based laminates such as CoFe/Pt, CoFeB/P and similar. The material of the soft magnetic underlayer 74 can have either in-plane or perpendicular anisotropy.

The storage layer 76 has a thickness of 5-25 nm and more specifically of about 8-15 nm; and coercivity less than 1000 Oe and more specifically of about 200-500 Oe. The storage layer 76 is made of magnetic material with a substantial perpendicular anisotropy such as Co, Fe or Ni-based alloys or multilayers such as Co/Pt, Co/Pd, Co/Au, CoFe/Pt, Fe/Pt, Fe/Pd, Ni/Cu or similar.

The spin-polarizing layer 84 has a thickness of 0.5-5 nm and is made of a soft magnetic material with a coercivity of about 1-200 Oe and a substantial spin polarization such as CoFe, CoFeB, NiFe, Co, Fe, CoPt, FePt, CoPtCu, FeCoPt and similar or their based laminates such as CoFe/Pt, CoFeB/P and similar. The material of the spin-polarizing layer 84 can have either in-plane or perpendicular anisotropy.

The reference layer 86 has a thickness of 10-100 nm and more specifically of about 20-50 nm; and coercivity above than 1000 Oe and more specifically of about 2000-5000 Oe. The reference layer 86 is made of magnetic material with a substantial perpendicular anisotropy such as Co, Fe or Ni-based alloys or multilayers such as Co/Pt, Co/Pd, Co/Au, CoFe/Pt, Fe/Pt, Fe/Pd, Ni/Cu or similar.

The spacer layer 112 has a thickness of about 0.5-5 nm and more specifically of about 0.8-2 nm. The spacer layer 112 is made of a non-magnetic material such as Ru, Re, Cu, Pt, Pd, Au, Al, Ta or similar and their based alloys or metal doped insulator such as MgO—Mg, $Al_2O_3$—Al, $SiO_2$—Cu or similar.

It is understood that the above description is intended to be illustrative, and not restrictive. Many other embodiments will be apparent to those of skill in the art upon reviewing the above description. The scope of the should be, therefore, determined with reference to the appended claims, along with the full scope of equivalents to which such claims are entitled.

What is claimed is:

1. A method of writing to a magnetic memory cell comprising:
   providing a magnetic tunnel junction element adjacent to a first conductor line and means for current supply, the magnetic tunnel junction element comprising a pinned layer comprising a fixed magnetization direction directed substantially perpendicular to a film plane, a free layer comprising a reversible magnetization direction directed substantially perpendicular in its equilibrium state to the film plane, and a tunnel barrier layer residing between the pinned layer and the free layer;
   driving a bias current pulse through the first conductor line in a proximity to but not through the magnetic tunnel junction element and producing a bias magnetic field along a magnetic hard axis of the free layer;
   driving a spin-polarized current pulse through the tunnel magnetic junction element along a magnetic easy axis of the free layer, and producing a spin momentum transfer;
   whereby the magnetization direction in the free layer is reversed by a collective effect of the substantially superimposed pulses of the bias and spin-polarized currents.

2. The method of claim 1, wherein a magnitude of the bias current pulse does not change substantially when the spin-polarized current pulse turns on or turns off.

3. The method of claim 1, wherein a magnitude of the spin-polarized current pulse does not change substantially when the bias current pulse turns on or turns off.

4. The method of claim 1, wherein the means for current supply comprise:
   a voltage source;
   a bias current circuitry connected in series with the first conductor line and the voltage source, and
   a spin-polarized current circuitry comprising a selection device, a second conductor line overlapping the first conductor line and a spin-polarized current driver connected to the selection device through the second conductor line,
   wherein the magnetic tunnel junction element is connected in series with the voltage source and the selection device.

5. The method of claim 1, wherein the free layer further comprises:
   a storage layer comprising a first coercivity and a reversible magnetization direction directed substantially perpendicular in its equilibrium state to the film plane, and
   a soft magnetic layer comprising a second coercivity that is substantially lower than the first coercivity, the soft magnetic layer is substantially magnetically coupled to the storage layer,
   wherein the soft magnetic underlayer is disposed between the tunnel barrier layer and the storage layer.

6. The method of claim 1, wherein the pinned layer further comprises:
   a reference layer comprising a fixed magnetization direction directed substantially perpendicular to the film plane, and a spin-polarizing layer substantially magnetically coupled to the reference layer,
wherein the spin-polarizing layer is disposed between the reference layer and the tunnel barrier layer.

7. The method of claim 1, wherein the magnetic tunnel junction element further comprises:
a first contact layer, and
a second contact layer,
wherein the first contact layer is disposed between the free layer and the first conductor line, and the second contact layer is disposed between the pinned layer and the selection device.

8. The method of claim 7, wherein the first contact layer further comprises:
a non-magnetic sublayer, and
a magnetic sublayer,
wherein the magnetic sublayer is disposed adjacent the free layer and substantially magnetically coupled to the free layer.

9. The method of claim 1, wherein the first conductor line further comprises:
a conductor layer, and
a magnetic cladding layer,
wherein the magnetic cladding layer is disposed at least on a side of the conductor layer distal from the magnetic tunnel junction element.

10. A magnetic memory cell comprising:
a magnetoresistive element comprising a free layer comprising a reversible magnetization direction directed substantially perpendicular to a film plane, a pinned layer comprising a fixed magnetization direction directed substantially perpendicular to the film plane, and a tunnel barrier layer disposed between the free and pinned layers;
a means for providing a bias magnetic field along magnetic hard axis of both the free layer and the pinned layer, and
a means for providing a spin-polarized current through the magnetoresistive element along magnetic easy axis of both the free layer and the pinned layer.

11. The magnetic memory cell of claim 10, wherein the means for providing the bias magnetic field comprises:
a first conductor line disposed adjacent to the magnetoresistive element;
a voltage source, and
a bias current circuitry,
wherein the first conductor line, the voltage source and the bias current circuitry are connected in series.

12. The magnetic memory cell of claim 11, wherein the magnetoresistive element further comprises:
a first contact layer disposed between the magnetoresistive element and the first conductor line, and
a second contact layer disposed between the magnetoresistive element and the selection device.

13. The magnetic memory cell of claim 12, wherein the first contact layer further comprises:
a non-magnetic sublayer, and
a magnetic sublayer,
wherein the magnetic sublayer is disposed adjacent the free layer and substantially magnetically coupled to the free layer.

14. The magnetic memory cell of claim 11, wherein the first conductor line further comprises:
a non-magnetic conductor layer, and
a magnetic cladding layer,
wherein the magnetic cladding layer is disposed at least on a side of the non-magnetic conductor layer distal from the magnetoresistive element.

15. The magnetic memory cell of claim 10, wherein the means for providing the spin-polarized current comprises:
the voltage source,
a selection device,
a spin-polarized current driver connected to the selection device by a second conductor line overlapping the first conductor line,
wherein the magnetoresistive element, the voltage source and the selection device are connected in series.

16. The magnetic memory cell of claim 10, wherein the free layer further comprises:
a storage layer comprising a first coercivity and a magnetization direction directed substantially perpendicular to the film plane, and
a soft magnetic layer comprising a second coercivity which is substantially lower than the first coercivity, the soft magnetic layer is substantially magnetically coupled to the storage layer,
wherein the soft magnetic layer is disposed between the tunnel barrier layer and the storage layer.

17. The magnetic memory cell of claim 16 wherein the free layer further comprises a non-magnetic spacer layer disposed between the soft magnetic layer and the storage layer.

18. The magnetic memory cell of claim 16, wherein the storage layer further comprises:
a first storage sublayer comprising a magnetization direction directed substantially perpendicular to the film plane,
a non-magnetic spacer layer, and
a second storage sublayer comprising a magnetization direction directed substantially perpendicular to the film plane,
wherein the first and second storage sublayers are substantially magnetically coupled to each other and a coercivity of the first storage sublayer is substantially different from a coercivity of the second storage sublayer.

19. The magnetic memory cell of claim 10, wherein the pinned layer further comprises:
a reference layer comprising a magnetization direction directed substantially perpendicular to the film plane, and
a spin-polarizing layer substantially magnetically coupled to the reference layer,
wherein the spin-polarizing layer is disposed between the reference layer and the tunnel barrier layer.

20. The magnetic memory cell of claim 19, wherein the pinned layer further comprises a non-magnetic spacer layer disposed between the reference layer and the spin-polarizing layer.

* * * * *